United States Patent
Kim et al.

(10) Patent No.: US 11,812,837 B2
(45) Date of Patent: Nov. 14, 2023

(54) DECORATIVE MEMBER FOR COSMETICS CONTAINER, AND METHOD FOR PRODUCING SAME

(71) Applicant: LG CHEM, LTD., Seoul (KR)

(72) Inventors: Yong Chan Kim, Daejeon (KR); Ki Hwan Kim, Daejeon (KR); Nansra Heo, Daejeon (KR); Jeong Woo Shon, Daejeon (KR); Pilsung Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 286 days.

(21) Appl. No.: 16/755,531

(22) PCT Filed: Mar. 19, 2019

(86) PCT No.: PCT/KR2019/003165
§ 371 (c)(1),
(2) Date: Apr. 10, 2020

(87) PCT Pub. No.: WO2019/198939
PCT Pub. Date: Oct. 17, 2019

(65) Prior Publication Data
US 2021/0186179 A1    Jun. 24, 2021

(30) Foreign Application Priority Data

Apr. 10, 2018  (KR) .................. 10-2018-0041562

(51) Int. Cl.
*B32B 7/023* (2019.01)
*B32B 3/30* (2006.01)
(Continued)

(52) U.S. Cl.
CPC .............. *A45D 33/18* (2013.01); *A45D 34/00* (2013.01); *A45D 40/00* (2013.01);
(Continued)

(58) Field of Classification Search
None
See application file for complete search history.

(56) References Cited

U.S. PATENT DOCUMENTS

| 3,338,730 A | 8/1967 | Slade et al. |
| 3,684,348 A | 8/1972 | Rowland |

(Continued)

FOREIGN PATENT DOCUMENTS

| CN | 2056903 U | 5/1990 |
| CN | 1235678 A | 11/1999 |

(Continued)

OTHER PUBLICATIONS

"Refractive Index Info", https://refractiveindex.info/?shelf=main&book=AI&page=Rakic, available via Internet Wayback Machine https://web.archive.org/web/20160214085108/https://refractiveindex.info/?shelf=main&book=AI&page=Rakic (Year: 2016).*

(Continued)

*Primary Examiner* — Laura C Powers
(74) *Attorney, Agent, or Firm* — Bryan Cave Leighton Paisner LLP

(57) ABSTRACT

A decoration member for a cosmetic container including: a color expression layer having a light reflecting layer and a light absorbing layer provided on the light reflecting layer; and a substrate provided on one surface of the color expression layer.

11 Claims, 10 Drawing Sheets

(51) Int. Cl.

| | | |
|---|---|---|
| B44F 1/02 | (2006.01) | |
| B44F 1/08 | (2006.01) | |
| B32B 27/06 | (2006.01) | |
| A45D 33/18 | (2006.01) | |
| B29C 45/00 | (2006.01) | |
| C08J 7/04 | (2020.01) | |
| A45D 34/00 | (2006.01) | |
| A45D 40/00 | (2006.01) | |
| B29C 45/26 | (2006.01) | |
| G02B 5/00 | (2006.01) | |
| B32B 15/08 | (2006.01) | |
| C01B 21/082 | (2006.01) | |
| G02B 5/22 | (2006.01) | |
| B29K 101/00 | (2006.01) | |
| B65D 1/02 | (2006.01) | |
| C23C 14/00 | (2006.01) | |
| B29C 45/16 | (2006.01) | |

(52) U.S. Cl.
CPC .......... *B29C 45/0001* (2013.01); *B29C 45/26* (2013.01); *B32B 3/30* (2013.01); *B32B 7/023* (2019.01); *B32B 15/08* (2013.01); *B32B 27/06* (2013.01); *B44F 1/02* (2013.01); *B44F 1/08* (2013.01); *C01B 21/0825* (2013.01); *C08J 7/0423* (2020.01); *G02B 5/003* (2013.01); *G02B 5/223* (2013.01); *A45D 2034/007* (2013.01); *A45D 2040/0012* (2013.01); *A45D 2200/053* (2013.01); *B29C 45/1679* (2013.01); *B29K 2101/00* (2013.01); *B29K 2901/12* (2013.01); *B29K 2995/002* (2013.01); *B32B 2255/28* (2013.01); *B32B 2307/4026* (2013.01); *B32B 2307/416* (2013.01); *B32B 2439/40* (2013.01); *B32B 2451/00* (2013.01); *B65D 1/0207* (2013.01); *C08J 2367/02* (2013.01); *C23C 14/0036* (2013.01)

(56) References Cited

U.S. PATENT DOCUMENTS

| | | |
|---|---|---|
| 5,734,501 A | 3/1998 | Smith |
| 7,630,109 B2 | 12/2009 | Phillips et al. |
| 7,923,122 B2 | 4/2011 | Korechika et al. |
| 9,903,989 B2 | 2/2018 | Kim et al. |
| 2003/0224181 A1 | 12/2003 | Finley et al. |
| 2004/0012966 A1 | 1/2004 | Takasaki et al. |
| 2004/0013805 A1 | 1/2004 | Nagata et al. |
| 2005/0063067 A1* | 3/2005 | Phillips ............... G07D 7/0032 359/613 |
| 2005/0208389 A1* | 9/2005 | Ishibashi ................ G03F 1/58 430/5 |
| 2006/0275625 A1* | 12/2006 | Lieberman ............ B41F 31/002 428/689 |
| 2006/0285184 A1 | 12/2006 | Phillips et al. |
| 2008/0131693 A1 | 6/2008 | Hiruma et al. |
| 2008/0206495 A1 | 8/2008 | Korechika et al. |
| 2010/0060987 A1 | 3/2010 | Witzman et al. |
| 2010/0128204 A1 | 5/2010 | Omote et al. |
| 2011/0053057 A1 | 3/2011 | Nozawa |
| 2011/0199685 A1 | 8/2011 | Ito |
| 2011/0262713 A1 | 10/2011 | Nakao et al. |
| 2011/0273356 A1 | 11/2011 | Kawaguchi et al. |
| 2011/0308693 A1 | 12/2011 | Van Nutt et al. |
| 2012/0140316 A1 | 6/2012 | Suzuki et al. |
| 2012/0196095 A1 | 8/2012 | Tanida et al. |
| 2012/0300306 A1 | 11/2012 | Nagahama et al. |
| 2015/0064469 A1 | 3/2015 | Takazaki |
| 2015/0212244 A1 | 7/2015 | Kim et al. |
| 2017/0015802 A1 | 1/2017 | Hall et al. |
| 2017/0052295 A1 | 2/2017 | Sakuma et al. |
| 2018/0033893 A1 | 2/2018 | Lee et al. |
| 2018/0267638 A1 | 9/2018 | Yoon et al. |
| 2019/0098946 A1 | 4/2019 | Bee et al. |
| 2019/0099979 A1 | 4/2019 | Bee et al. |
| 2019/0153776 A1 | 5/2019 | Arima et al. |
| 2019/0381761 A1 | 12/2019 | Cho et al. |
| 2021/0124100 A1 | 4/2021 | Kim et al. |

FOREIGN PATENT DOCUMENTS

| | | |
|---|---|---|
| CN | 1461963 A | 12/2003 |
| CN | 101642005 A | 2/2010 |
| CN | 101666886 A | 3/2010 |
| CN | 102282288 A | 12/2011 |
| CN | 102289017 A | 12/2011 |
| CN | 102741714 A | 10/2012 |
| CN | 104220634 A | 12/2014 |
| CN | 104602909 A | 5/2015 |
| CN | 106457753 A | 2/2017 |
| CN | 107112075 A | 8/2017 |
| CN | 107407846 A | 11/2017 |
| CN | 110730716 A | 1/2020 |
| EP | 0 982 605 A1 | 1/2000 |
| EP | 2192428 A1 | 6/2010 |
| EP | 2420391 A2 | 2/2012 |
| EP | 2891554 A1 | 7/2015 |
| EP | 3593991 A1 | 1/2020 |
| EP | 3647053 A1 | 5/2020 |
| JP | S55-159964 A | 12/1980 |
| JP | 62-146624 A | 6/1987 |
| JP | 2000-047613 A | 2/2000 |
| JP | 2001-503879 A | 3/2001 |
| JP | 2003265226 A | 9/2003 |
| JP | 3116498 A | 12/2005 |
| JP | 2006-350355 A | 12/2006 |
| JP | 2008-062562 A | 3/2008 |
| JP | 2009-089843 A | 4/2009 |
| JP | 2009-131998 A | 6/2009 |
| JP | 2009-186929 A | 8/2009 |
| JP | 2010-173273 A | 8/2010 |
| JP | 2010-188713 A | 9/2010 |
| JP | 2011-16291 A | 1/2011 |
| JP | 2011-140136 A | 7/2011 |
| JP | 2011-170295 A | 9/2011 |
| JP | 2011-173379 A | 9/2011 |
| JP | 2011-186414 A | 9/2011 |
| JP | 4938693 B2 | 5/2012 |
| JP | 5016722 B2 | 9/2012 |
| JP | 2013223928 A * | 10/2013 |
| JP | 2015-68849 A | 4/2015 |
| JP | 2015-101024 A | 6/2015 |
| JP | 2015-210319 A | 11/2015 |
| JP | 2016010569 A | 1/2016 |
| JP | 2016-40667 A | 3/2016 |
| JP | 2017-094638 A | 6/2017 |
| JP | 2017-191305 A | 10/2017 |
| JP | 2010197798 A | 9/2019 |
| KR | 2000-0017521 A | 3/2000 |
| KR | 10-2005-0010019 A | 1/2005 |
| KR | 10-2008-0078523 A | 8/2008 |
| KR | 10-2009-0099858 A | 9/2009 |
| KR | 1020120065068 A | 6/2012 |
| KR | 1020130048718 A | 5/2013 |
| KR | 10-2017-0086294 A | 7/2017 |
| KR | 10-2017-0133109 A | 12/2017 |
| KR | 10-2018-0102026 A | 9/2018 |
| TW | 201022051 A | 6/2010 |
| TW | 201038330 A1 | 11/2010 |
| WO | 9533392 A1 | 12/1995 |
| WO | 2014173974 A2 | 10/2014 |

OTHER PUBLICATIONS

JP2013223928A EPO Machine Translation.*
Color Difference and Formulas Abstract Oct. 29, 2020.
Search Report of European Patent Office in Appl'n No. 19784315.4, dated Mar. 11, 2021.
International Search Report from PCT/KR2019/003165, dated Jun. 24, 2019.

(56) References Cited

OTHER PUBLICATIONS

Written Opinion of the ISA from PCT/KR2019/003165, dated Jun. 24, 2019.
Office Action of Korean Patent Office in Appl'n No. 10-2019-0031164 dated Jan. 7, 2020.
Office Action of the U.S. Patent Office Office in U.S. Appl. No. 16/980,299, dated Nov. 2, 2022.
Office Action of Chinese Patent Office in Appl'n No. 201980017986.4, dated Nov. 26, 2021.

\* cited by examiner (1) Equilateral Triangle Pyramid
(2) Square Pyramid
(3) Circular Cone 4 fold symmetry maintained    symmetry broken Rotational axis

DECORATIVE MEMBER FOR COSMETICS CONTAINER, AND METHOD FOR PRODUCING SAME

CROSS-REFERENCE TO RELATED APPLICATIONS

This application is a U.S. national stage of international Application No. PCT/KR2019/003165 filed on Mar. 19, 2019, and claims priority to and the benefit of Korean Patent Application No. 10-2018-0041562 filed in the Korean Intellectual Property Office on Apr. 10, 2018, the entire contents of which are incorporated herein by reference.

TECHNICAL FIELD

The present application relates to a decoration member for a cosmetic container and a method of manufacturing the same.

BACKGROUND

The design of a cosmetic container, various mobile devices, and home appliances, for example, a color, a shape, and a pattern, other than a function of the product, plays a big role in increasing the product value for customers. Preference and price of a product also depend on the design.

As one example, in the case of a cosmetic compact container, various colors and color senses are implemented by various methods and applied to a product. The method of implementing various colors and color senses comprises a method of giving a color to a case material itself and a method of attaching a decoration film implemented with colors and a shape to a case material to give a design.

In an existing decoration film, a color is expressed by a method of printing, deposition, and the like. In the case where heterogeneous colors are expressed on a single surface, printing needs to be performed two or more times, and in order to print various colors on a three-dimensional pattern, it is realistically difficult to implement various colors. In addition, in the existing decoration film, a color is fixed according to a viewing angle, and even though a color is slightly changed, the degree of difference in a color sense is limited.

SUMMARY

The present application provides a decoration member for a cosmetic container, which is capable of easily implementing various colors, implementing various colors in a three-dimensional pattern as necessary, and providing a change in color according to a viewing angle.

An exemplary embodiment of the present application provides a decoration member for a cosmetic container, the decoration member comprising: a color expression layer comprising a light reflecting layer and a light absorbing layer provided on the light reflecting layer; and a substrate for a cosmetic container provided on one surface of the color expression layer.

According to another exemplary embodiment of the present application, the color expression layer may further comprise a color film provided on a surface of the light reflecting layer opposite to a surface facing the light absorbing layer, between the light reflecting layer and the light absorbing layer, or on a surface of the light absorbing layer opposite to a surface facing the light reflecting layer.

According to another exemplary embodiment of the present application, when the color film exists, the color film makes chrominance $\Delta E^*ab$ that is a distance in a space of $L^*a^*b^*$ in the color coordinates CIE $L^*a^*b^*$ of the color expression layer exceed 1, compared to the case where the color film is not provided.

According to another exemplary embodiment of the present application, a substrate is provided on a surface of the light reflecting layer opposite to a surface facing the light absorbing layer, or on a surface of the light absorbing layer opposite to a surface facing the light reflecting layer. The substrate may be provided on a surface of the light reflecting layer opposite to a surface facing the light absorbing layer, and the color film may be provided between the substrate and the light reflecting layer or on a surface of the substrate opposite to a surface facing the light reflecting layer. The substrate may be provided on a surface of the light absorbing layer opposite to a surface facing the light reflecting layer, and the color film may be provided between the substrate and the light absorbing layer, or on a surface of the substrate opposite to a surface facing the light absorbing layer.

According to another exemplary embodiment of the present application, the light absorbing layer comprises two or more points of which thicknesses are different.

According to another exemplary embodiment of the present application, the light absorbing layer comprises two or more regions of which thicknesses are different.

According to another exemplary embodiment of the present application, the light absorbing layer comprises one or more regions each of which an upper surface has an inclined surface having an inclination angle larger than 0° and 90° or less, and the light absorbing layer comprises one or more regions which have thicknesses different from a thickness of any one region having an inclined surface.

According to another exemplary embodiment of the present application, the light absorbing layer comprises one or more regions each of which a thickness is gradually changed.

According to another exemplary embodiment of the present application, the light absorbing layer comprises one or more regions each of which an upper surface has an inclined surface having an inclination angle larger than 0° and 90° or less, and the region having at least one inclined surface has a structure in which a thickness of the light absorbing layer is gradually changed.

According to another exemplary embodiment of the present application, the light absorbing layer has a value of an extinction coefficient (k) of larger than 0 to 4 or less at 400 nm, preferably, 0.01 to 4.

According to the exemplary embodiments described in the present specification, when external light is incident and reflected through the color expression layer, the light is absorbed in an incident path and in a reflection path during the reflection, and the external light is reflected from a surface of the light absorbing layer and a surface of the light reflecting layer, so that constructive interference and destructive interference phenomena are generated between the reflected light from the surface of the light absorbing layer and the reflected light from the surface of the light reflecting layer. Accordingly, a specific color may be expressed through the light absorption in the incident path and the reflection path and the constructive interference and destructive interference phenomena. Accordingly, a specific color may be implemented according to a reflectivity spectrum according to a material of the light reflecting layer and a composition of the light absorbing layer. In addition, the expressed color depends on a thickness, so that even though the color expression layer has the same material configuration, a color may be changed according to a thickness of the color expression layer.

In addition, when the color film is additionally comprised, it is possible to more greatly increase a range of a color to be implemented even though the materials and the thicknesses of the light reflecting layer and the light absorbing layer are determined. A width of the change in a color according to the addition of the color filter may be defined by chrominance (ΔE*ab) which is a difference in L*a*b* before and after the application of the color filter. In addition, the light absorbing layer has two or more points or regions having different thicknesses on the same surface, so that a plurality of colors may be expressed, and the color expression layer is formed in a three-dimensional pattern, so that it is possible to implement various colors in the three-dimensional pattern.

Further, when an upper surface of the light absorbing layer has at least one inclined surface, an expressed color may be changed according to a viewing angle, and the light absorbing layer may be manufactured to have two or more regions having different thicknesses with a simple process.

Further, the decoration member for the cosmetic container according to the exemplary embodiment of the present application may comprise the color expression layer on a plastic molding or a glass substrate for a cosmetic container, so that it is possible to provide various color changes, and manufacture a cosmetic container having an excellent aesthetic value with low cost.

REFERENCE NUMERALS AND SYMBOLS AS USED HEREIN

Figure 1:
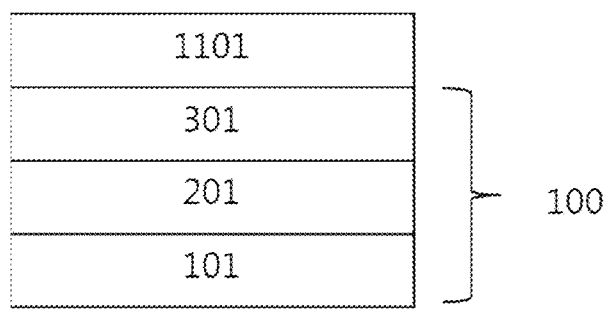
FIG. 1 illustrates a stacking structure of a decoration member for a cosmetic container according to an exemplary embodiment.

100: Color expression layer
101: Transparent substrate
201: Light reflecting layer
301: Light absorbing layer
401, 401a, 401b, 401c, 401d: Color film
1101: Substrate for cosmetic container

DETAILED DESCRIPTION

Hereinafter, the present invention will be described in detail.

In the present specification, a "point" means one location that does not have an area. In the present specification, the expression "point" is used for representing that there are two or more points at which thicknesses of a light absorbing layer are different from each other.

In the present specification, a "region" means a portion having a predetermined area. For example, when the decoration member is laid on the ground so that a light reflecting layer is located in a lower portion and the light absorbing layer is located in an upper portion, and both end portions of an inclined surface or both end portions having the same thickness are vertically divided with respect to the ground, a region having the inclined surface means an area divided into both end portions of the inclined surface, and a region having the same thickness means an area divided into both end portions having the same thickness.

In the present specification, a "surface" or a "region" may also be a plane, but is not limited thereto, and an entirety or a part of a "surface" or a "region" may be a curved surface. For example, a form of a vertical cross-section may comprise a part of a circle or an elliptical arc, a wave structure, a zigzag structure, and the like.

In the present specification, an "inclined surface" means a surface of which an angle with respect to an upper surface based on the ground is larger than 0° and 90° or smaller when the decoration member is laid on a ground so that a light reflecting layer is located in a lower portion and the light absorbing layer is located in an upper portion.

In the present specification, a "thickness" of a specific layer means the shortest distance from a lower surface to an upper surface of the corresponding layer.

In the present specification, a term "or" represents the case where listed matters are selectively or all comprised unless otherwise is defined, that is, means "and/or".

In the present specification, a "layer" means that an area in which the corresponding layer exists is covered by 70% or more. Preferably, a "layer" means that an area in which the corresponding layer exists is covered by 75% or more, and more preferably, 80% or more.

A decoration member according to an exemplary embodiment of the present application comprises: a color expression layer comprising a light reflecting layer, and a light absorbing layer provided on the light reflecting layer; and a cosmetic container substrate provided on one surface of the color expression layer.

In the present specification, resistance or sheet resistance may be measured by using a publicly known sheet resistor according to a 4-point probe scheme. Sheet resistance is measured by measuring a resistance value (V/I) by measuring a current (I) and a voltage (V) by using four probes, calculating sheet resistance (V/I×W/L) by using a distance (L) between electrodes for measuring an area (cross-section area, W) and resistance of a sample, and multiplying the calculated sheet resistance and a resistivity correction factor for calculating the sheet resistance in ohm/square that is a unit of sheet resistance. The resistivity correction factor may be calculated by using a size of a sample, a thickness of a sample, and a temperature at the time of a measurement, and may be calculated by a Poisson equation. Sheet resistance of an entire stacked body may be measured and calculated in the stacked body itself, and sheet resistance of each layer may be measured before layers, except for a target layer desired to be measured in the entire stacked body, formed of the remaining materials are formed, measured after layers, except for a target layer desired to be measured in the entire stacked body, formed of the remaining materials are removed, or measured by analyzing a material of a target layer and forming a layer under the same condition as that of the target layer.

In the exemplary embodiment of the present specification, the cosmetic container substrate may comprise a plastic molding material or a glass substrate for a cosmetic container. More particularly, the plastic molding may comprise one or more kinds among polypropylene (PP), polystyrene (PS), polyvinyl acetate (PVAC), polyacrylate, polyethylene terephthalate (PET), polyvinyl chloride (PVC), polymethyl methacrylate (PMMA), ethylene-vinyl acetate copolymer (EVA), polycarbonate (PC), polyamide, styrene-acrylonitrile copolymer (SAN), but is not limited thereto.

Further, the plastic molding may have a flat form with no curve (specific pattern), and may be a plastic molding having a curved form (specific pattern).

The plastic molding may be manufactured by a plastic molding method. The plastic molding method comprises compression molding, injection molding, air blow molding, thermoforming, heat melting molding, foaming molding, roll forming, reinforced plastic molding, and the like. The compression molding is a molding method of putting a material in a mold frame, heating the material, and then applying pressure to the material, and is the oldest molding method, and may be mainly used in molding a thermosetting resin, such as a phenol resin. The injection molding is a molding method of pushing a plastic melted solution with a carrier and filling a mold frame with the plastic melted solution through a nozzle, and is capable of molding both a thermoplastic resin and a thermosetting resin and is the most widely used molding method. A resin currently used in a cosmetic case is SAN. The air blow molding is a method of putting plastic parison to a center of a mold frame and injecting air to mold a product, and is a molding method of manufacturing a plastic bottle or a small vessel and has a very fast manufacturing speed of a product.

In the exemplary embodiment of the present specification, glass having transmissivity of 80% or more may be used as the glass substrate.

A thickness of the substrate for a cosmetic container may be selected according to a need, and may have a range of, for example, 50 to 200 μm.

In the exemplary embodiment of the present application, the decoration member for the cosmetic container may be manufactured by the operation of forming the color expression layer comprising the light reflecting layer on the substrate for the cosmetic container and the light absorbing layer provided on the light reflecting layer. More particularly, the decoration member for the cosmetic container may be formed by sequentially forming the light absorbing layer and the light reflecting layer on the substrate for the cosmetic container by using a deposition process and the like, and by sequentially forming the light reflecting layer and the light absorbing layer on the substrate for the cosmetic container by using a deposition process and the like, but the present application is not limited thereto.

FIG. 1 is a diagram illustrating an example of a stacking structure of the decoration member according to the exemplary embodiment of the present application. FIG. 1 illustrates a decoration member comprising a color expression layer 100 and a substrate 1101 for a cosmetic container. The color expression layer 100 comprises a transparent substrate 101, a light reflecting layer 201, and a light absorbing layer 301. FIG. 1 illustrates the structure in which the transparent substrate 101 is provided at the light reflecting layer 201 side of the color expression layer 100, but the transparent substrate 101 may be omitted or may also be provided at a surface opposite to the surface that is in contact with the light absorbing layer 201 of the light reflecting layer 301.

Figure 2:
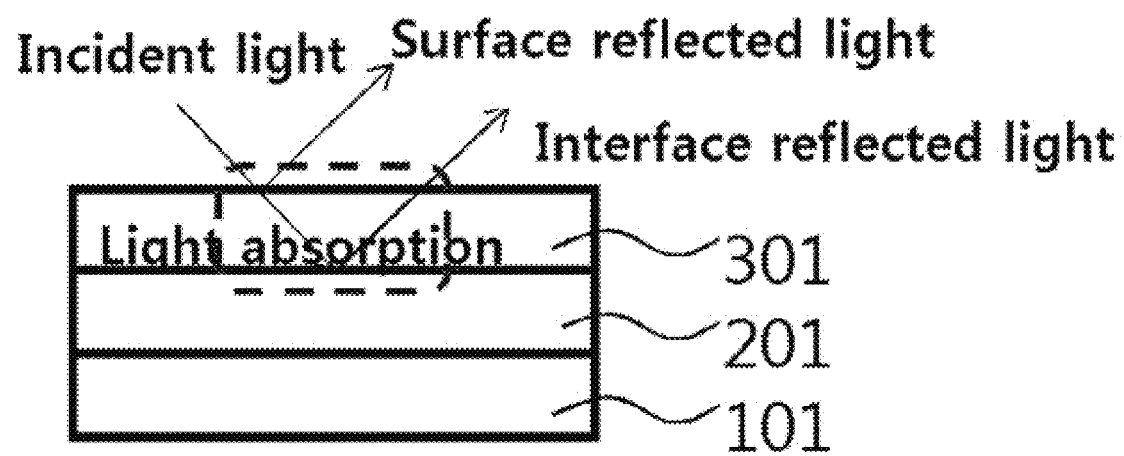
FIG. 2 is a schematic illustration of a principle of action of a color expression in a light reflecting layer and light absorbing layer structure.

According to the exemplary embodiments, in the light absorbing layer, light is absorbed in an incident path and a reflection path of light, and further, light is reflected from a surface of the light absorbing layer and an interface between the light absorbing layer and the light reflecting layer, so that two elements of reflected light constructively interfere or destructively interfere. In the present specification, light reflected from the surface of the light absorbing layer may be expressed as surface reflected light, and the light reflected from the interface from the light absorbing layer and the light reflecting layer may be expressed as interface reflected light. FIG. 2 is a schematic diagram of principle of action of the reflected light. FIG. 2 illustrates the example of the structure in which the transparent substrate 101 is provided at the light reflecting layer 201 side, but the present application is not limited thereto, and the transparent substrate 101 may also be disposed at another position as described above.

According to another exemplary embodiment of the present application, when the light absorbing layer comprises a pattern, the pattern may have a symmetric structure, an asymmetric structure, or a combination thereof.

According to an example, the light absorbing layer may comprise a pattern of a symmetric structure. The symmetric structure comprises a prism structure, a lenticular lens structure, and the like.

According to another exemplary embodiment of the present application, the light absorbing layer may have a pattern of an asymmetric structure.

In the present specification, the asymmetric structure means that at least one of an upper surface, a lateral surface, and a cross-section has an asymmetric structure when the upper surface, the lateral surface, and the cross-section are viewed. When the light absorbing layer has the asymmetric structure, the decoration member may express dichroism. The dichroism means that a different color is observed according to a viewing angle.

The dichroism may be expressed as $\Delta E^{*}ab=\sqrt{\{(\Delta L^{*})^{2}+(\Delta a^{*})^{2}+(\Delta b^{*})^{2}\}}$ related to chrominance, when chrominance according to a viewing angle is $\Delta E^{*}ab>1$, the decoration member may be defined to have dichroism.

According to one example, the light absorbing layer comprises a pattern, an upper surface of which has a protruding portion or a recess portion shaped like a cone. The form of the corn comprises a cone, an elliptical cone, or a polypyramid. Herein, the form of a bottom surface of the polypyramid has a triangle, a quadrangle, a polygon having five or more protruding points, and the like. The form of the cone may also be the form of the protruding portion formed on the upper surface of the light absorbing layer, or may also be the form of the recess portion formed on the upper surface of the light absorbing layer. A cross-section of the protruding portion has a triangular shape, and a cross-section of the recess portion has an inverted triangular shape. A lower surface of the light absorbing layer may also have the same shape as that of the upper surface of the light absorbing layer.

Figure 7A:
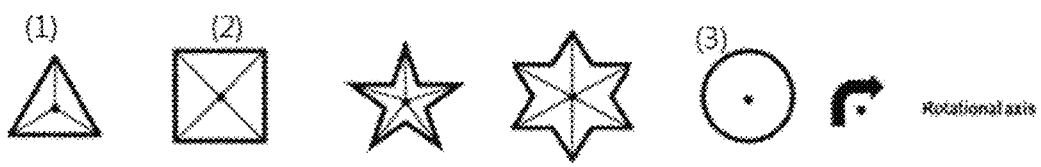
FIGS. 7(A), 7(B), 8, 9(A), 9(B) and 10(A) to 10(I) are illustrations of various structures of upper surfaces of light absorbing layers of decoration members for a cosmetic container according to exemplary embodiments.
Figure 7B:
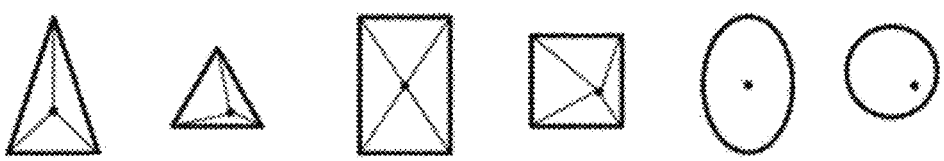

According to an example, the cone may have an asymmetric structure. For example, when the pattern is observed from the upper surface and there are the three or more same forms during the rotation of the light absorbing layer 360° based on an apex of the cone, it is difficult to express dichroism from the pattern. However, when the pattern is observed from the upper surface and when the pattern has two or less identical forms during the rotation of the pattern 360° based on an apex of the cone, the dichroism may be expressed. FIGS. 7(A) and 7(B) illustrate the upper surface of the cone. FIG. 7(A) illustrates cones having a symmetric structure and FIG. 7(B) illustrates cones having an asymmetric structure.

The form of the cone having the symmetric structure has a structure in which a bottom surface of the form of the cone is a circle or a regular polygon of which the respective sides have the same length, and an apex of the cone exists in a vertical line of a center of gravity of the bottom surface. However, the form of the cone having the asymmetric structure has a structure in which a position of an apex of the cone exists in a vertical line of a point that is not the center of gravity of the bottom surface, or a structure in which the bottom surface has a polygon or an ellipse having an asymmetric structure when observed from the upper side. In the case where the bottom surface has the polygon having the asymmetric structure, at least one of the sides or angles of the polygon may be differently designed from the remainders.

Figure 8:
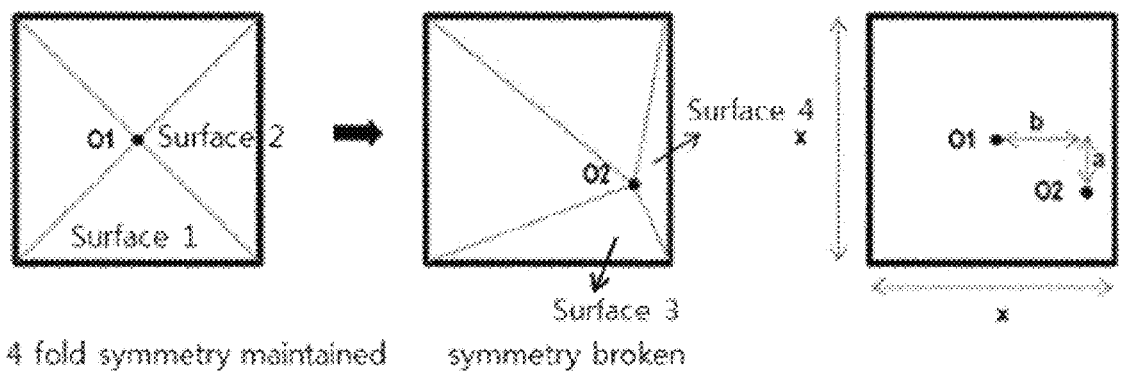

For example, as illustrated in FIG. 8, a position of the apex of the cone may be changed. Particularly, as illustrated in the first figure of FIG. 8, when an apex of the cone is designed to be located in a vertical line of the center O1 of gravity of the bottom surface when the pattern is viewed from an upper surface, four same structures (4 fold symmetry) may be obtained when the pattern is rotated 360° based on the apex of the cone. However, the apex of the cone is designed to be located at a position O2, not the center O1 of gravity of the bottom surface, so that the symmetric structure cannot be obtained. When it is assumed that a length of one side of the bottom surface is x, movement distances of the apex of the cone are a and b, a height of the form of the cone that is a length of a line vertically connected from the apex O1 or O2 of the cone to the bottom surface is h, and an angle formed between the bottom surface and a lateral surface of the cone is θn, cosine values may be obtained for surface 1, surface 2, surface 3, and surface 4 of FIG. 8 as described below.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

In this case, θ1 is the same as θ2, so that there is no dichroism. However, θ3 is different from θ4, and |θ3−θ4| means chrominance (E*ab) between two colors, so that dichroism may be represented. Herein |θ3−θ4|>0. As described above, it is possible to quantitatively represent how much the symmetric structure is broken, that is, the degree of asymmetry by using the angle formed between the bottom surface and the lateral surface of the cone, and a numerical value representing the degree of asymmetry is in proportion to chrominance of dichroism.

Figure 9A:
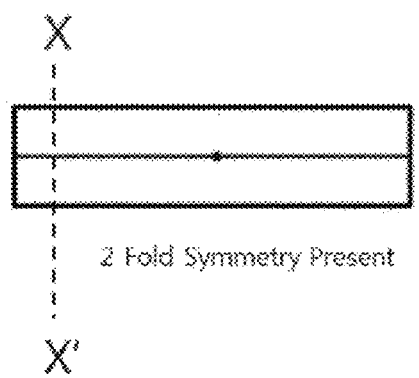
Figure 9B:
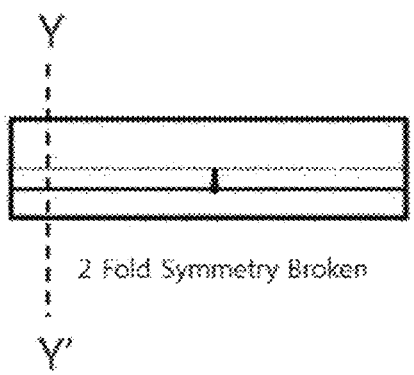
Figure 9B:
Figure 9B:
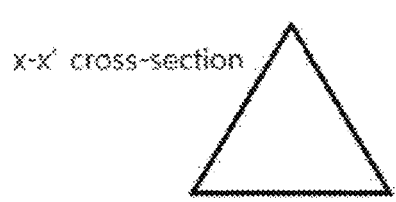
Figure 9B:
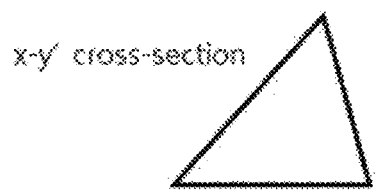
Figure 10A:
Figure 10B:
Figure 10C:
Figure 10D:
Figure 10E:
Figure 10F:
Figure 10G:
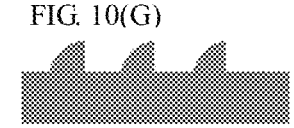
Figure 10H:
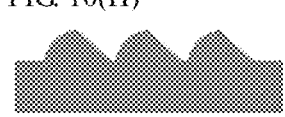
Figure 10I:

According to another example, the light absorbing layer comprises a pattern in which the highest point has a protruding portion shaped like a line or the lowest point has a recess portion shaped like a line. The line shape may straight, curved or both. During the observation of the pattern having the protruding portion or the recess portion shaped like the line from the upper surface, when two or more identical forms exist when the pattern is rotated by 360° based on a center of gravity of the upper surface, it is difficult to express dichroism. However, during the observation of the pattern having the protruding portion or the recess portion shaped like the line from the upper surface, when only one identical form exists when the pattern is rotated by 360° based on a center of gravity of the upper surface, dichroism may be expressed. FIGS. 9(A) and 9(B) illustrate the upper surface of the pattern having the protruding portion shaped like the line. FIG. 9(A) illustrates an example of the pattern having the protruding portion shaped like the line which does not express dichroism and FIG. 9(B) illustrates an example of the pattern having the protruding portion shaped like the line which expresses dichroism. A cross-section taken along line X-X' of FIG. 9(A) is an isosceles triangle or an equilateral triangle, and a cross-section taken along line Y-Y' of FIG. 9(B) is a triangle of which lengths of lateral sides are different from each other.

According to another example, the light absorbing layer comprises a pattern having a protruding portion or a recess portion having a structure in which a cone-shaped upper surface is cut. A cross-section of the pattern may have the form of a trapezoid or a reversed trapezoid. Even in this case, the upper surface, the lateral surface, or the cross-section is designed to have an asymmetric structure, thereby expressing dichroism.

In addition to the structure examples, various patterns having protruding portions or recess portions may be implemented as illustrated in FIGS. 10(A) to 10(I).

According to another exemplary embodiment of the present application, the light absorbing layer may comprise two or more regions having different thicknesses.

Figure 3:
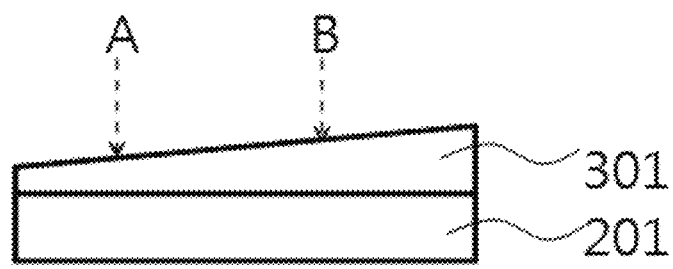
FIGS. 3 to 6 are illustrations of stacking structures of decoration members for a cosmetic container according to exemplary embodiments
Figure 4:
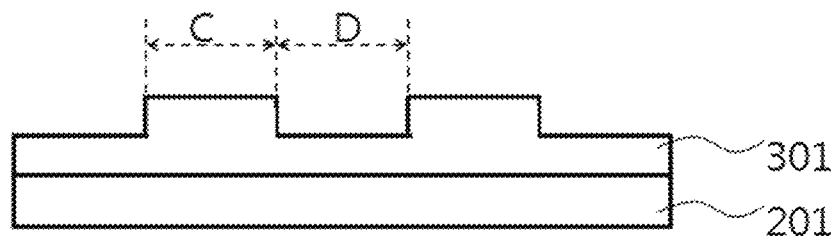

An example of the structure according to the exemplary embodiment is illustrated in FIGS. 3 and 4. FIGS. 3 and 4 illustrate examples of the structure in which the light reflecting layer 201 and the light absorbing layer 301 are stacked. According to FIGS. 3 and 4, the light absorbing layer 301 has two or more points of which thicknesses are different from each other. According to FIG. 3, thicknesses of the light absorbing layer 301 at point A and point B are different. According to FIG. 4, thicknesses of the light absorbing layer 301 at region C and region D are different.

According to another exemplary embodiment of the present application, the light absorbing layer comprises one or more regions each of which an upper surface has an inclined surface having an inclination angle larger than 0° and 90° or less, and the light absorbing layer comprises one or more regions having a different thickness from a thickness of any one region having an inclined surface.

A surface characteristic, such as the degree of inclination of the upper surface, of the light reflecting layer may be the same as that of the upper surface of the light absorbing layer. For example, by using a deposition method during the forming of the light absorbing layer, the upper surface of the light absorbing layer may have the same degree of inclination as that of the upper surface of the light reflecting layer.

Figure 5:
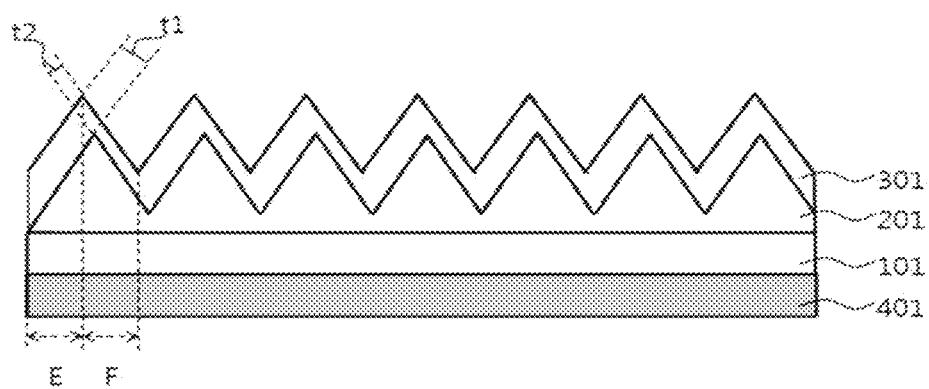

FIG. 5 illustrates an example of a structure of the decoration member comprising the light absorbing layer of which an upper surface has an inclined surface. The decoration member comprises the structure in which the transparent substrate 101, the light reflecting layer 201, and the light absorbing layer 301 are stacked, and a thickness t1 in region E of the light absorbing layer 301 is different from a thickness t2 in region F.

FIG. 5 relates to the light absorbing layer having facing inclined surfaces, that is, a structure in which a cross-section has a triangular shape. As illustrated in FIG. 5, in the structure of the pattern having the facing inclined surfaces, even though the deposition is progressed under the same condition, the thickness of the light absorbing layer may be different in two surfaces of the triangular structure. Accordingly, it is possible to form the light absorbing layer having two or more regions having different thicknesses only with a one-time process. Accordingly, an expressed color is different according to the thickness of the light absorbing layer. In this case, when a thickness of the light reflecting layer is equal to or larger than a predetermined thickness, the light reflecting layer does not influence on a change in color.

FIG. 5 illustrates the example of the structure in which the transparent substrate 101 is provided at the light reflecting layer 201 side, but the present invention is not limited thereto, and the transparent substrate 101 may also be disposed at a different position from those described above. In addition, a surface of the transparent substrate 101 of FIG. 5 which is in contact with the light reflecting layer 201 is a flat surface, but the surface of the transparent substrate 101 of FIG. 5 which is in contact with the light reflecting layer 201 may have a pattern having the same inclination as that of the upper surface of the light reflecting layer 201. In this case, because of the difference in an inclination of the pattern of the transparent substrate, a thickness of the light absorbing layer may also be different. However, the present invention is not limited thereto, even though the substrate and the light absorbing layer are formed to have different inclinations by using a different deposition method, a thickness of the light absorbing layer is different at both sides of the pattern, so that dichroism may be expressed.

According to another exemplary embodiment of the present application, the light absorbing layer comprises one or more regions each of which a thickness is gradually changed. FIG. 3 illustrates a structure in which a thickness of the light absorbing layer is gradually changed.

Figure 6:
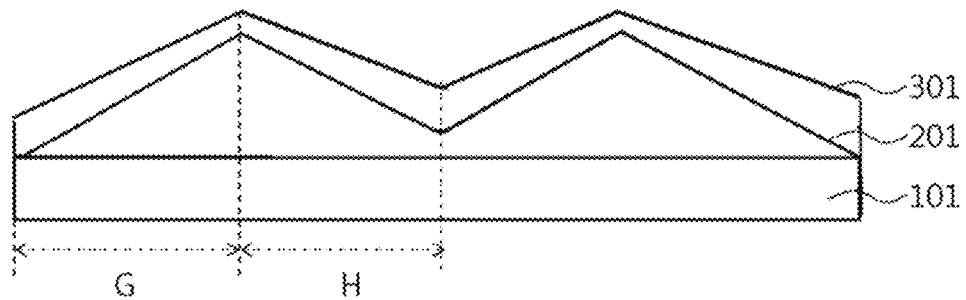

According to another exemplary embodiment of the present application, the light absorbing layer comprises one or more regions each of which an upper surface has an inclined surface having an inclination angle larger than 0° and 90° or less, and the region having at least one inclined surface has a structure in which a thickness of the light absorbing layer is gradually changed. FIG. 6 illustrates an example of the structure of the light absorbing layer comprising a region of which an upper surface has an inclined surface. In FIG. 6, in both region G and region H, the upper surface of the light absorbing layer has an inclined surface, and a thickness of the light absorbing layer is gradually changed.

According to an example, the light absorbing layer comprises a first region having a first inclined surface of which an inclination angle is in the range of 1° to 90°, and may further comprise a second region of which an upper surface has a different inclination direction from that of the first inclined surface, has an inclined surface having a different inclination angle, or is horizontal. In this case, the thickness of the light absorbing layer may be different between the first region and the second region.

According to another example, the light absorbing layer comprises a first region having a first inclined surface of which an inclination angle is in the range of 1° to 90°, and may further comprise two or more regions each of which an upper surface has a different inclination direction from that of the first inclined surface, has an inclined surface having a different inclination angle, or is horizontal. In this case, the thickness of the light absorbing layer may be different in the first region and the two or more regions.

According to another exemplary embodiment of the present application, the color expression layer comprises a color film provided on a surface of the light reflecting layer opposite to a surface facing the light absorbing layer, between the light reflecting layer and the light absorbing layer, or a surface of the light absorbing layer opposite to a surface facing the light reflecting layer.

As long as a color film makes chrominance $\Delta E^*ab$ that is a distance in a space of $L^*a^*b^*$ in the color coordinates CIE $L^*a^*b^*$ of the color expression layer exceed 1 when the color film exists, compared to the case where the color film is not provided, the color film is not particularly limited.

The color may be expressed with CIE $L^*a^*b^*$, and chrominance may be defined by using a distance ($\Delta E^*ab$) in the space of $L^*a^*b^*$. Particularly, $\Delta E^*ab=\sqrt{\{(\Delta L^*)^2+(\Delta a^*)^2+(\Delta b^*)^2\}}$, and within the range of $0<\Delta E^*ab<1$, an observer cannot recognize a color difference (reference document: Machine Graphics and Vision 20(4): 383-411). Accordingly, in the present specification, chrominance according to the addition of the color film may be defined as $\Delta E^*ab>1$.

Figure 11A:
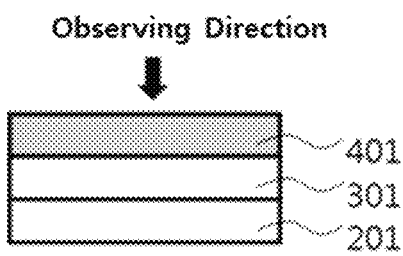
FIGS. 11(A) to 11(C), 12(A) and 12(B), 13(A) to 13(E) and 14(A) to 14(E) are illustrations of various stacking structures of decoration members for a cosmetic container according to exemplary embodiments of the present application.
Figure 11B:
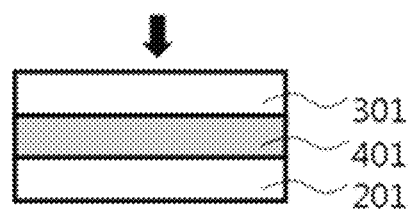
Figure 11C:
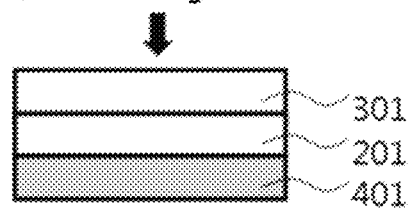

FIGS. 11(A) to 11(C) illustrate the color expression layer comprising a color film. FIG. 11(A) illustrates an example of a structure, in which the light reflecting layer 201, the light absorbing layer 301, and a color film 401 are sequentially stacked, FIG. 11(B) illustrates an example of a structure, in which the light reflecting layer 201, the color film 401, and the light absorbing layer 301 are sequentially stacked, and FIG. 11(C) illustrates an example of a structure, in which the color film 401, the light reflecting layer 201, and the light absorbing layer 301 are sequentially stacked.

The color film may also serve as the substrate. For example, when pigment or dye is added to a material usable as a substrate, the material may be used as the color film.

Figure 12A:
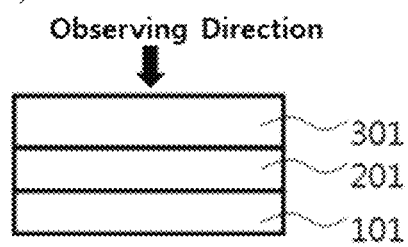
Figure 12B:
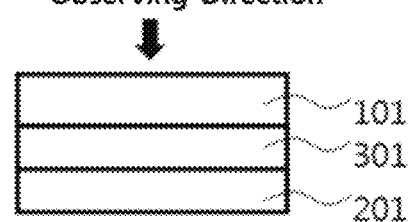

A substrate may be provided on a surface of the light reflecting layer opposite to a surface facing to the light absorbing layer (FIG. 12(A)), or a surface of the light absorbing layer opposite to a surface facing to the light reflecting layer (FIG. 12(B)).

For example, when the transparent substrate is provided on the surface of the light reflecting layer opposite to the surface facing the light absorbing layer and the color film is located on the surface of the light reflecting layer opposite to the surface facing the light absorbing layer, the color film may be provided between the transparent substrate and the light reflecting layer, or on a surface of the transparent substrate opposite to a surface facing the light reflecting layer. As another example, when the transparent substrate is provided on the surface of the light absorbing layer opposite to the surface facing the light reflecting layer and the color film is located on the surface of the light absorbing layer opposite to the surface facing the light reflecting layer, the color film may be provided between the transparent substrate and the light absorbing layer, or on a surface of the transparent substrate opposite to a surface facing the light absorbing layer.

Figure 13A:
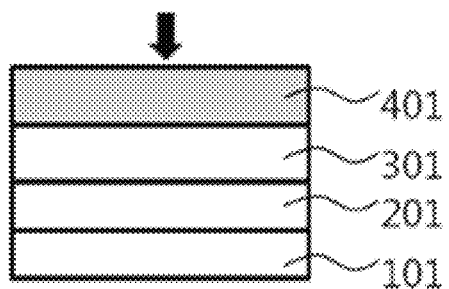
Figure 13D:
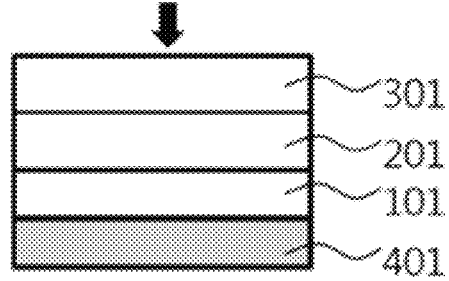
Figure 13B:
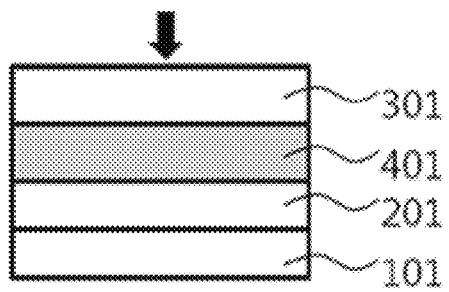
Figure 13E:
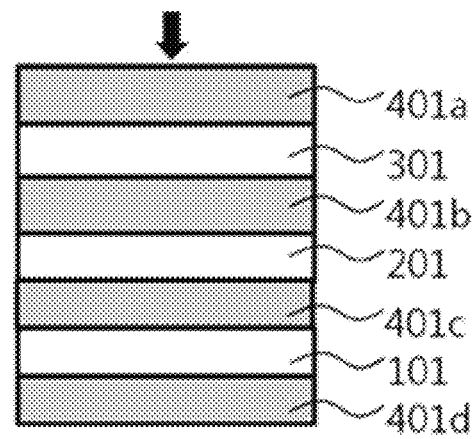
Figure 13C:
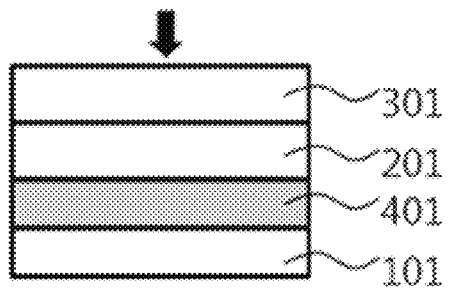

According to another exemplary embodiment of the present application, a transparent substrate is provided on a surface of the light reflecting layer opposite to a surface facing the light absorbing layer, and a color film is additionally provided. FIG. 13(A) illustrates a structure in which the color film 401 is provided on a surface of the light absorbing layer 301 opposite to the light reflecting layer 201, FIG. 13(B) illustrates a structure in which the color film 401 is provided between the light absorbing layer 301 and the light reflecting layer 201, FIG. 13(C) illustrates a structure in which the color film 401 is provided between the light reflecting layer 201 and the transparent substrate 101, and FIG. 13(D) illustrates a structure in which the color film 401 is provided on a surface of the transparent substrate 101 opposite to the light reflecting layer 201. FIG. 13(E) illustrates an example of a structure in which color films 401a, 401b, 401c, and 401d are provided on a surface of the light absorbing layer 301 opposite to the light reflecting layer 201, between the light absorbing layer 301 and the light reflecting layer 201, between the light reflecting layer 201 and the transparent substrate 101, and on a surface of the transparent substrate 101 opposite to the light reflecting layer 201, respectively, but the present invention is not limited thereto, and one to three among the color films 401a, 401b, 401c, and 401d may also be omitted.

Figure 14A:
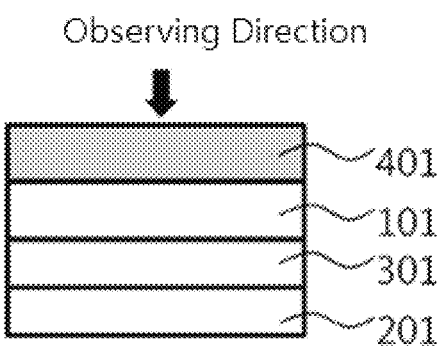
Figure 14D:
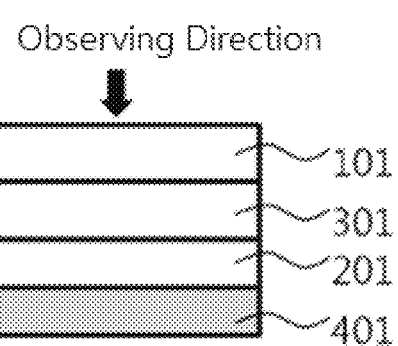
Figure 14B:
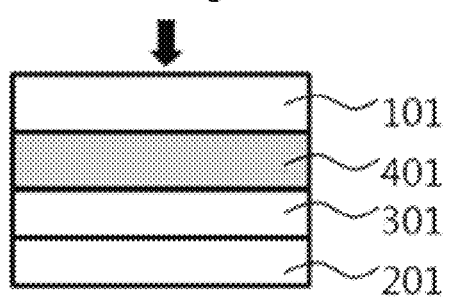
Figure 14E:
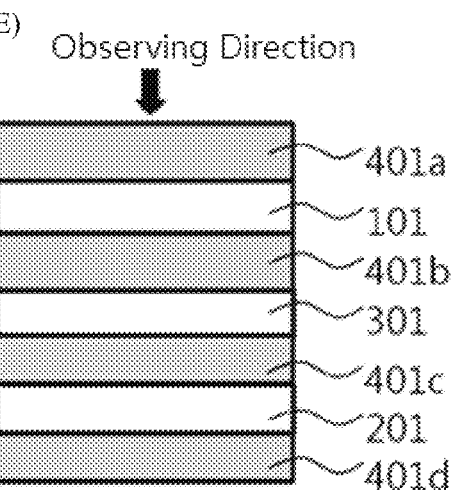
Figure 14C:
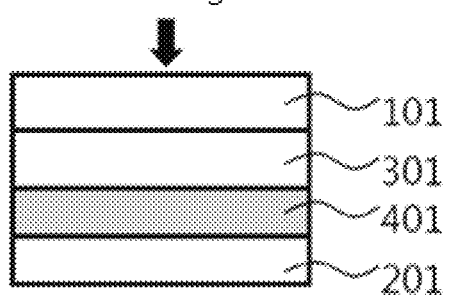

According to another exemplary embodiment of the present application, a substrate is provided on a surface of the light absorbing layer opposite to a surface facing the light reflecting layer, and a color film is additionally provided. FIG. 14(A) illustrates a structure in which the color film 401 is provided on a surface of the transparent substrate 101 opposite to the light absorbing layer 301, FIG. 14(B) illustrates a structure in which the color film 401 is provided between the transparent substrate 101 and the light absorbing layer 301, FIG. 14(C) illustrates a structure in which the color film 401 is provided between the light absorbing layer 301 and the light reflecting layer 201, and FIG. 14(D) illustrates a structure in which the color film 401 is provided on a surface of the light reflecting layer 201 opposite to the light absorbing layer 301. FIG. 14(E) illustrates an example of a structure in which color films 401a, 401b, 401c, and 401d are provided on a surface of the transparent substrate 101 opposite to the light absorbing layer 301, between the transparent substrate 101 and the light absorbing layer 301, between the light absorbing layer 301 and the light reflecting layer 201, and on a surface of the light reflecting layer 201 opposite to the light absorbing layer 301, respectively, but the present invention is not limited thereto, and one to three among the color films 401a, 401b, 401c, and 401d may also be omitted.

In the structures of FIGS. 13(B) and 14(C), when transmissivity of visible rays of the color film exceeds 0%, the light reflecting layer may reflect light which passes through the color film and is incident, so that it is possible to implement colors according to the stacking of the light absorbing layer and the light reflecting layer.

In the structures of FIGS. 13(C), 13(D) and 14(D), in order to recognize a change in chrominance according to the addition of the color film, light transmissivity of a color expressed from the color film of the light reflecting layer 201 may be 1% or more, preferably 3% or more, and more preferably 5% or more. The reason is that light transmitted in the range of the visible ray transmissivity may be mixed with a color by the color film.

The color film may be provided with one sheet or in the state where two or more same kinds of or heterogeneous sheets are stacked.

As the color film, a color film which is capable of expressing a desired color by mixing a color expressed from the stacking structure of the light reflecting layer and the light absorbing layer may be used. For example, a color film, in which one kind or two or more kinds of pigment and dye are dispersed in a matrix resin to express a color, may be used. The color film may be formed by directly coating a composition for forming a color film on a location at which the color film may be provided, coating a composition for forming a color film on a separate substrate, or manufacturing a color film by using a publicly known molding method, such as casting and extrusion, and then disposing or attaching the color film to a location at which the color film may be provided. As the coating method, wet coating or dry coating may be used.

The pigment and the dye comprisable in the color film, which are the pigment and the dye expressible a desired color from a final decoration member, may be selected from the pigment and the dye known in the art, and one kind or two or more kinds of the pigment and the dye based on red, yellow, purple, blue, pink, and the like may be used. Particularly, dye, such as perinone-based red dye, anthraquinone-based red dye, methane-based yellow dye, anthraquinone-based yellow dye, anthraquinone-based purple dye, phthalocyanine-based blue dye, thioindigo-based pink dye, and isoxindigo-based pink dye may be solely used, or a combination thereof may be used. Dye, such as carbon black, copper phthalocyanine (C.I. Pigment Blue 15:3), C.I. Pigment Red 112, Pigment blue, Isoindoline yellow, may be solely used, or a combination thereof may be used. As the pigment or the dye, commercially available pigment or dye may be used, and for example, materials produced by Ciba ORACET Company, Chokwang Paint Ltd., and the like may be used. The kind and the color of the pigment and the dye are simply illustrative, and publicly known dye or pigment may be variously used, and thus more various colors may be expressed.

The matrix resin comprised in the color film is a material of a transparent film, a primer layer, an adhesive layer, a coating layer, and the like, and publicly known materials may be used as the matrix resin, and the material is not particularly limited. For example, various materials, such as an acryl-based resin, a polyethylene terephthalate-based resin, a urethane-based resin, a linear olefin-based resin, a cycloolefin-based resin, an epoxy-based resin, and a triacethylcellulose-based resin, may be selected, and a copolymer or a mixture of the materials may also be used.

In the case where the color film is disposed to be closer to a location at which the decoration member is observed than the light reflecting layer or the light absorbing layer, for example, in the structures of FIGS. 13(A), 13(B) and 14(A) to 14(C), light transmissivity of a color of the light reflecting layer, the light absorbing layer, or the stacking structure of the light reflecting layer and the light absorbing layer expressed from the stacking structure may be 1% or more, preferably 3% or more, and more preferably 5% or more. Accordingly, the color expressed from the color film is mixed with the color expressed from the light reflecting layer, the light absorbing layer, or the stacking structure of the light reflecting layer and the light absorbing layer, thereby achieving a desired color.

A thickness of the color film is not particularly limited, and as long as the color film expresses a desired color, those skilled in the art may select and set a thickness of the color film. For example, a thickness of the color film may be 500 nm to 1 mm.

Figure 15:
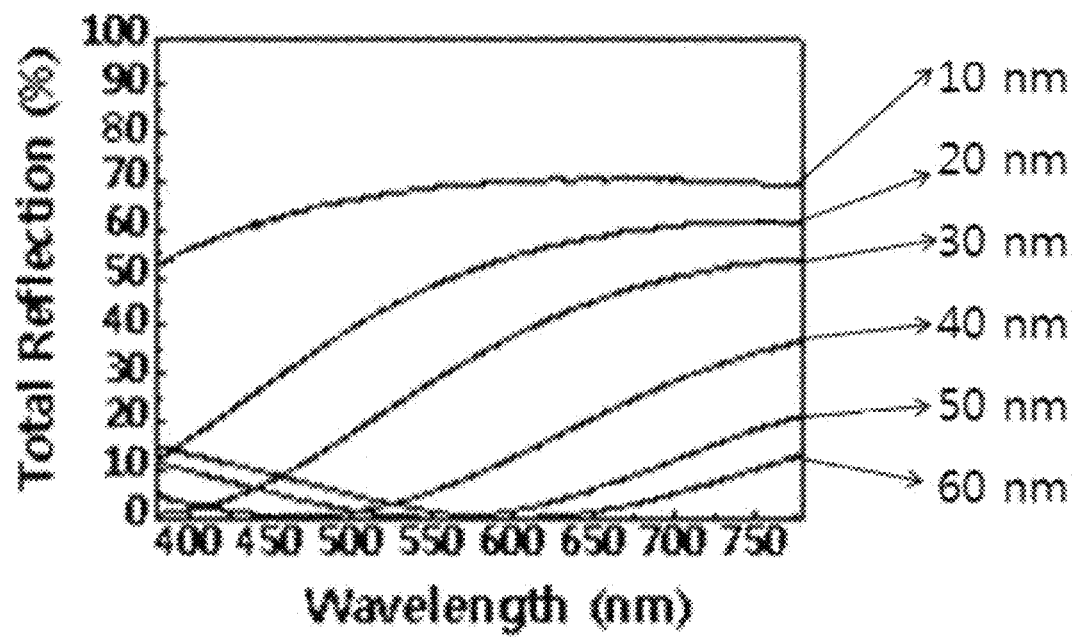
FIG. 15 is a graph showing the reflectivity as a function of wavelength according to a thickness of the light absorbing layer.
Figure 16:
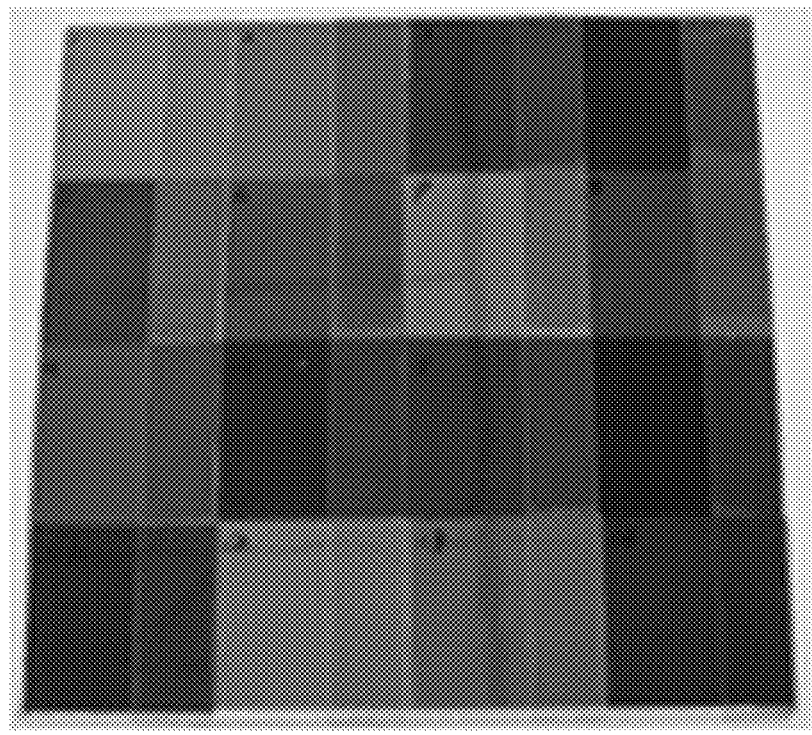
FIG. 16 shows the colors achieved according to the reflectivity of the light absorbing layer.

The light absorbing layer may implement various colors according to a refractive index (n), an extinction coefficient (k), and a thickness (t). FIG. 15 illustrates reflectivity based on a wavelength according to a thickness of the light absorbing layer, and FIG. 16 illustrates implemented colors based on reflectivity. Particularly, FIG. 15 is a simulation graph of reflectivity based on a CuO deposition thickness of CuO/Cu, and is data prepared while changing a thickness of CuO to 10 to 60 mm under the same deposition condition.

Figure 17:
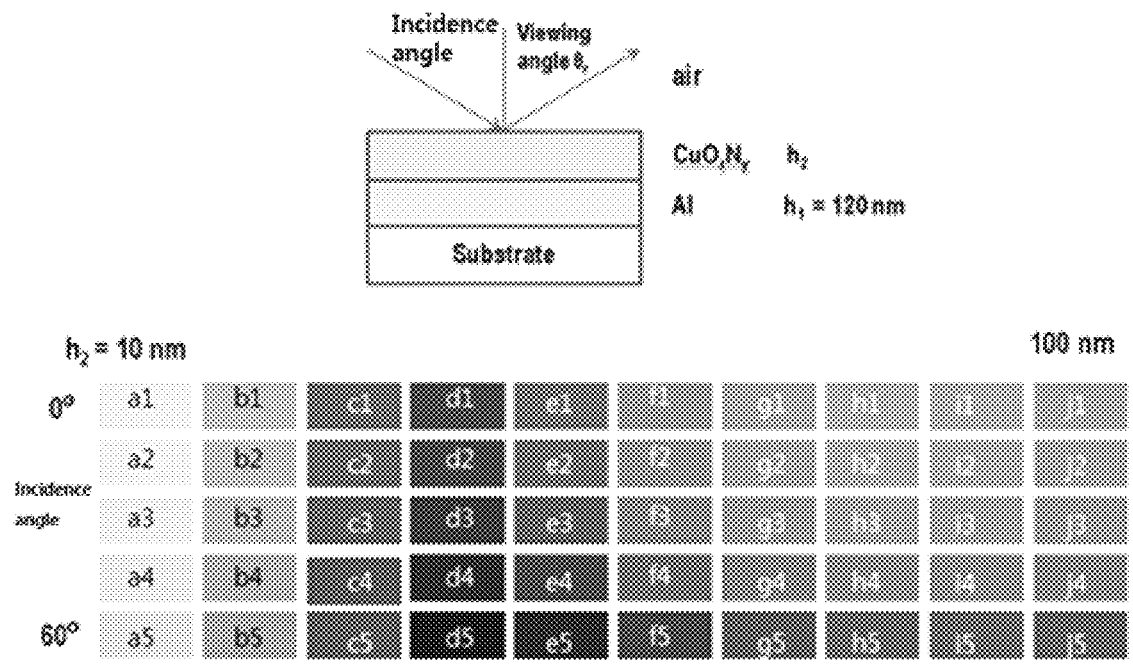
FIG. 17 is a simulation result representing the different colors observed according to a viewing angle.

FIG. 17 is a simulation result representing that a different color is observed according to a viewing angle. FIG. 17 illustrates a simulation result of CuON/Al. In FIG. 17, a thickness of the light absorbing layer is increased from 10 nm to 100 nm by 10 nm each, and an incident angle is adjusted from 0° to 60° by an interval of 15°. Through the simulation result, it can be seen that it is possible to implement various colors by adjusting a thickness of the light absorbing layer and an inclination angle of the upper surface of the light absorbing layer in the structure according to the exemplary embodiment of the present application. In addition, the color film is provided, so that it is possible to implement more various colors.

As long as a material is capable of reflecting light, the material is not particularly limited as the material of the light reflecting layer, but light reflectivity may be determined according to a material, and when the light reflectivity is, for example, 50% or more, it is easy to implement a color. Light reflectivity may be measured by an ellipsometer.

The light absorbing layer may have a refractive index (n) of 0 to 8 at a wavelength of 400 nm, may have a refractive index (n) of 0 to 7, may have a refractive index (n) of 0.01 to 3, and may have a refractive index (n) of 2 to 2.5. The refractive index (n) may be calculated by $\sin \theta 1/\sin \theta 2$ ($\theta 1$ is an angle of light incident from the surface of the light absorbing layer, and $\theta 2$ is a refractive angle of light inside the light absorbing layer).

The light absorbing layer may have a refractive index (n) of 0 to 8 at a wavelength of 380 nm to 780 nm, may have a refractive index (n) of 0 to 7, may have a refractive index (n) of 0.01 to 3, and may have a refractive index (n) of 2 to 2.5.

The light absorbing layer has an extinction coefficient (k) of larger than 0 and 4 or less at a wavelength of 400 nm, and may have an extinction coefficient (k) of 0.01 to 4, may have an extinction coefficient (k) of 0.01 to 3.5, may have an extinction coefficient (k) of 0.01 to 3, and may have an extinction coefficient (k) of 0.1 to 1. The extinction coefficient (k) is $-\lambda/4\pi I(dI/dx)$ (herein, this is a value obtained by multiplying a reduction fraction (dI/I) of intensity of light per a unit length (dx), for example, 1 m, of a path within the light absorbing layer by $\lambda/4\pi$, and $\lambda$ is a wavelength of light).

The light absorbing layer has an extinction coefficient (k) of larger than 0 and 4 or less at a wavelength of 380 nm to 780 nm, and may have an extinction coefficient (k) of 0.01 to 4, may have an extinction coefficient (k) of 0.01 to 3.5, may have an extinction coefficient (k) of 0.01 to 3, and may have an extinction coefficient (k) of 0.1 to 1.

The extinction coefficient (k) in a region of the entire visible ray wavelength of 400 nm, preferably, 380 nm to 780 nm, is within the range, so that the light absorbing layer may serve the role within the visible ray range.

For example, a spectrum absorbing light when the method of absorbing light by adding dye to a resin is used and a spectrum absorbing light when the material having the extinction coefficient described above is used is different. When light is absorbed by adding dye to the resin, an absorption wavelength band is fixed and only a phenomenon in which the amount of absorption is changed according to a change in a thickness of coating is generated. In addition, in order to obtain the desired amount of light absorption, a change in thickness of a minimum of several micrometers or more is required for adjusting the amount of light absorption. In the meantime, even though a thickness is changed by several or several tens of nanometers in the material having the extinction coefficient, a wavelength band of absorbed light is changed.

According to the exemplary embodiment, the light reflecting layer may be a metal layer, a metal oxide layer, a metal nitride layer, a metal oxynitride layer, or an inorganic layer. The light reflecting layer may be formed of a single layer, and may also be formed of multiple layers comprising two or more layers.

As an example, the light reflecting layer may be a single layer or a multi-layer comprising one or two or more kinds of materials selected from indium (In), titan (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chrome (Cr), cobalt (Co), gold (Au), and silver (Ag), or one or two or more kinds of materials among an oxide, a nitride, or an oxynitride thereof, carbon, and a carbon complex. For example, the light reflecting layer may comprise an alloy, an oxide, a nitride, or an oxynitride of two or more materials selected from the materials. According to another example, the light reflecting layer may be manufactured by using an ink comprising carbon or a carbon complex, thereby implementing the reflecting layer having high resistance. Carbon or a carbon complex comprises carbon black, Carbon Nano Tube (CNT), and the like. The ink comprising the carbon or the carbon complex may comprise the foregoing materials, or the oxide, the nitride, or the oxynitride thereof, and for example, comprise an oxide of one or two or more kinds of materials selected indium (In), titan (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chrome (Cr), cobalt (Co), gold (Au), and silver (Ag). After the ink comprising the carbon or the carbon complex is printed, a hardening process may be additionally performed.

When the light reflecting layer comprises two or more kinds of materials, the light reflecting layer may be formed of the two or more kinds of materials by using one process, for example, a deposition method or a printing method, but the light reflecting layer may be used by using a method in which a layer is first formed of one or more kinds of materials, and then a layer is formed of one or more additional kinds of materials on the formed layer. For example, the light reflecting layer may be formed by forming a layer by depositing indium or tin, printing an ink comprising carbon, and then hardening the ink. The ink may additionally comprise an oxide, such as a titanium oxide and a silicon oxide.

According to the exemplary embodiment, the light absorbing layer may also be a single layer and may also be a multi-layer comprising two or more layers.

The light absorbing layer may be formed of a material having an extinction coefficient (k) at 400 nm, preferably, 380 nm to 780 nm, that is, a material having an extinction coefficient of larger than 0 and 4 or less, preferably, 0.01 to 4.

For example, the light absorbing layer may comprise one or two or more selected from the group consisting of a metal, a metalloid, an oxide, a nitride, an oxynitride, and a carbide of a metal or a semi-metal. The oxide, the nitride, the oxynitride, or the carbide of the metal or the metalloid may be formed by a deposition condition set by those skilled in the art and the like. The light absorbing layer may also comprise the metal, the metalloid, the alloy or the oxynitride of two or more metals which is the same as that of the light reflecting layer.

For example, the light absorbing layer may be a single layer or a multi-layer comprising one or two or more kinds of materials selected from indium (In), titan (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chrome (Cr), cobalt (Co), gold (Au), and silver (Ag), or an oxide, a nitride, or an oxynitride thereof. As a particular example, the light absorbing layer comprises one or two or more kinds selected from a copper oxide, a copper nitride, a copper oxynitride, an aluminum oxide, an aluminum nitride, an aluminum oxynitride, and a molybdenum titanium oxynitride.

According to an example, the light absorbing layer comprises silicon (Si) or germanium (Ge).

The light absorbing layer formed of silicon (Si) or germanium (Ge) has a refractive index (n) of 0 to 8 at 400 nm, and may have a refractive index (n) of 0 to 7, and has an extinction coefficient (k) of larger than 0 and 4 or less, preferably, 0.01 to 4, 0.01 to 3, or 0.01 to 1.

According to another example, the light absorbing layer comprise one or two or more kinds selected from a copper oxide, a copper nitride, a copper oxynitride, an aluminum oxide, an aluminum nitride, an aluminum oxynitride, and a molybdenum titanium oxynitride. In this case, the light absorbing layer may have a refractive index (n) of 1 to 3, for example, 2 to 2.5, at 400 nm, and has an extinction coefficient (k) of larger than 0 and 4 or less, preferably, 0.01 to 2.5, preferably, 0.2 to 2.5, and more preferably, 0.2 to 0.6.

According to an example, the light absorbing layer is AlOxNy (x>0, y>0).

According to another example, the light absorbing layer may be AlOxNy (0≤x≤1.5, 0≤y≤1).

According to another example, the light absorbing layer is AlOxNy (x>0, y>0), and the number of respective atoms with respect to 100% of the total number of atoms satisfies the equation below.

$$1 < \frac{(Al)at \times 3}{(O)at \times 2 + (N)at \times 3} < 2$$

According to another example, the light absorbing layer may be formed of a material having an extinction coefficient (k) at 400 nm, preferably, 380 nm to 780 nm, and for example, the light absorbing layer/light reflecting layer may be formed of a material, such as CuO/Cu, CuON/Cu, CuON/Al, AlON/Al, AlN/AL/AlON/Cu, and AlN/Cu.

According to the exemplary embodiment, a thickness of the light reflecting layer may be determined according to a desired color in a final structure, and may be, for example, 1 nm or more, preferably, 25 nm or more, and for example, 50 nm or more, preferably, 70 nm or more.

According to the exemplary embodiment, a thickness of the light absorbing layer may be 5 nm to 500 nm, for example, 30 nm to 500 nm.

According to the exemplary embodiment, a difference in a thickness based on each region of the light absorbing layer is 2 nm to 200 nm, and may be determined according to a difference in a desired color.

According to the exemplary embodiment, the decoration member may further comprise a transparent substrate provided on a lower surface of the light reflecting layer or an upper surface of the light absorbing layer. A surface characteristic, such as the degree of inclination, of the upper surface of the substrate may be the same as those of the upper surfaces of the light reflecting layer and the light absorbing layer. The light reflecting layer and the light absorbing layer are formed by a deposition method, so that the substrate, the light reflecting layer, and the light absorbing layer may have the inclined surfaces having the same angle. For example, the foregoing structure may be implemented by forming an inclined surface or a three-dimensional structure on the upper surface of the substrate and sequentially depositing the light reflecting layer and the light absorbing layer on the inclined surface or the three-dimensional structure, or sequentially depositing the light absorbing layer and the light reflecting layer on the inclined surface or the three-dimensional structure.

According to an example, the inclined surface or the three-dimensional structure may be formed on the surface of the substrate by forming a pattern in an ultraviolet curable resin and hardening the pattern by using ultraviolet rays, or by a laser processing method. According to the exemplary embodiment, the decoration member may further comprise an adhesive layer as necessary.

A material of the substrate is not particularly limited, and when the inclined surface or the three-dimensional structure is formed by the foregoing method, an ultraviolet curable resin publicly known in the art may be used.

A protective layer may also be additionally provided on the light absorbing layer.

According to an example, an adhesive layer may be additionally provided on a surface of the substrate opposite to the surface provided with the light absorbing layer or the light reflecting layer. The adhesive layer may be an Optically Clear Adhesive (OCA) layer. A release liner for protection may be additionally provided on the adhesive layer as necessary.

In the present specification, as the example of the method of forming the light reflecting layer and the light absorbing layer, the deposition, such as the sputtering method, has been mentioned, but as long as the decoration member has the configurations and the characteristics according to the exemplary embodiments described in the present specification, various methods of manufacturing a thin film are applicable. For example, a vapor deposition method, Chemical Vapor Deposition (CVD), wet coating, and the like may be used.

In the exemplary embodiment of the present application, the cosmetic container may be a cosmetic compact nameplate, but is not limited thereto.

Hereinafter, the present invention will be described in more detail through the Examples. The Examples are simply provided for illustrating the present invention, and do not intend to limit the scope of the present invention.

EXAMPLE

Example 1

A flat plastic molded substrate (SAN resin) having no curve (specific pattern) was prepared. An aluminum oxynitride light absorbing layer having a thickness of 40 nm was formed on the plastic molded substrate by using reactive sputtering deposition under a vacuum condition of process pressure of 3 mTorr. The deposition process was carried out under vacuum at a base pressure of $3 \times 10^{-6}$ Torr and a process pressure of 3 mTorr, Ar gas was adjusted to 100 sccm, and an $N_2$ reactive gas partial pressure section was 10%. An Al layer having a thickness of 100 nm was formed on the light absorbing layer as a light reflecting layer by using a non-reactive deposition process (100% of Ar).

Example 2

Example 2 was performed in the same manner as described in Example 1 except that an aluminum oxynitride light absorbing layer was formed to have a thickness of 60 nm in Example 1.

Example 3

Example 3 was performed in the same manner as described in Example 2 except that a plastic molded substrate (SAN resin) having a curve (specific pattern) is used instead of the flat plastic molded substrate having no curve (specific pattern) of Example 2.

Example 4

Example 4 was performed in the same manner as described in Example 1 except that a plastic molded substrate (SAN resin) having a curve (specific pattern) is used instead of the flat plastic molded substrate having no curve (specific pattern) of Example 1.

Figure 18:
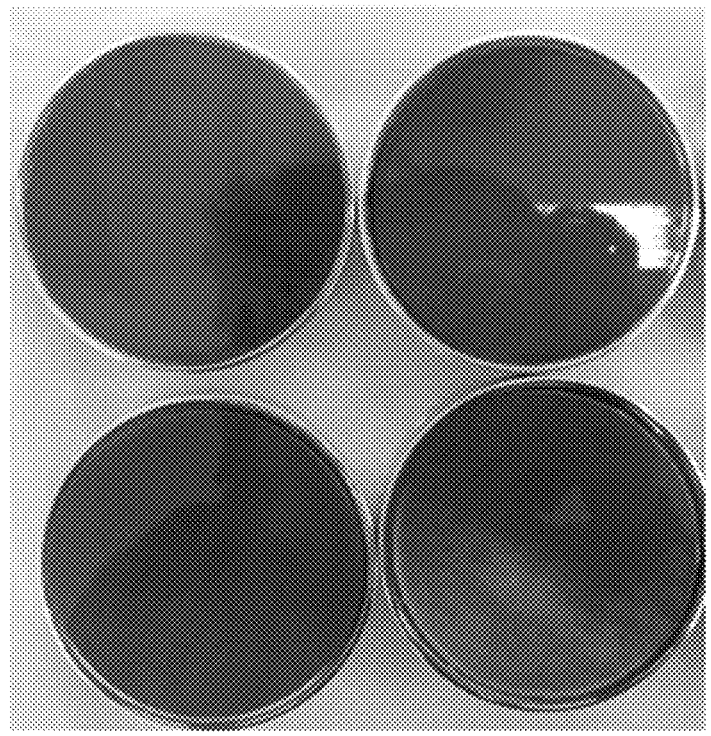
FIGS. 18 and 19 are illustrations of a decoration member for a cosmetic container according to an exemplary embodiment.
Figure 19:
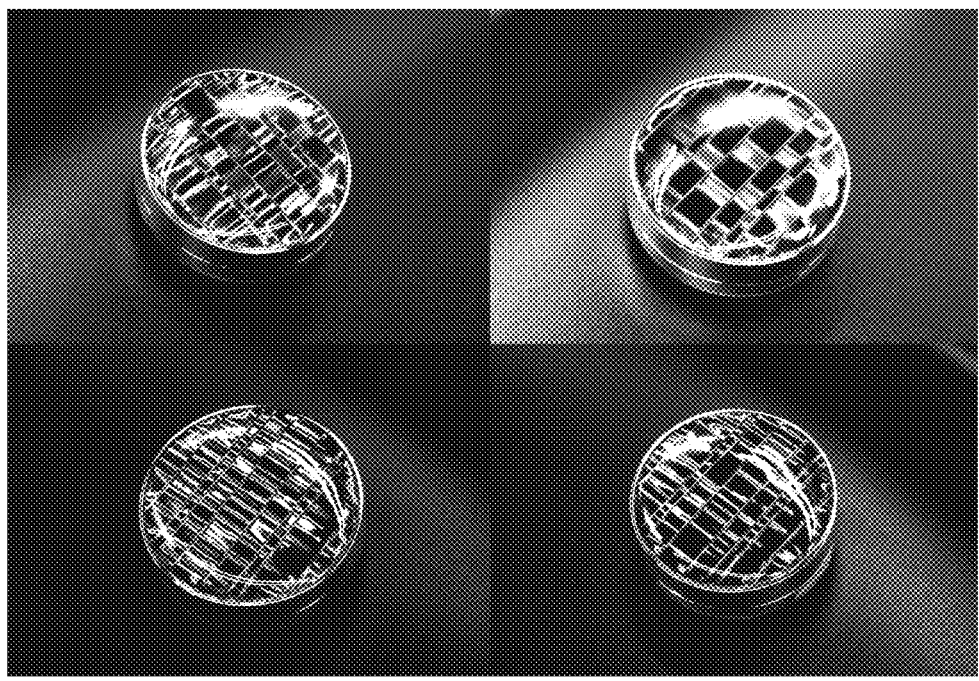

The decoration members for the cosmetic container according to the exemplary embodiments of the present invention are illustrated in FIGS. 18 and 19. More particularly, FIG. 18 illustrates the decoration member for the cosmetic container comprising the flat plastic molded substrate having no curve (specific pattern), and FIG. 19 illustrates the decoration member for the cosmetic container comprising the plastic molded substrate having a curve (specific pattern).

As described above, the decoration member for the cosmetic container according to the exemplary embodiment of the present invention may comprise the color expression layer on the plastic molding or the glass substrate for the cosmetic container, so that it is possible to provide various color changes, and manufacture a cosmetic container having an excellent aesthetic value with low cost.

The invention claimed is:

1. A decoration member for a cosmetic container, the decoration member comprising:
    a color expression layer comprising a light reflecting layer and a light absorbing layer provided on the light reflecting layer; and
    a substrate for a cosmetic container provided on one surface of the color expression layer,
    wherein the light absorbing layer comprises a metal oxynitride,
    wherein the light reflective layer is in continuous contact with the light absorbing layer,
    wherein a shape of an upper surface of the light reflective layer and a shape of an upper surface of the light absorbing layer are same,
    wherein the light absorbing layer comprises one or more first regions wherein an upper surface of each of the one or more first regions has a first inclined surface having an inclination angle larger than 0° and 90° or less, and the light absorbing layer comprises one or more second regions wherein an upper surface of each of the one or more second regions has a second inclined surface, wherein the second inclined surfaces have a different inclination direction from that of the first inclined surfaces, and have a different inclination angle from that of the first inclined surfaces, and
    wherein a thickness of the one or more second regions is different from a thickness of the one or more first regions.

2. The decoration member of claim 1, wherein the color expression layer further comprises a color film provided on a surface of the light reflecting layer opposite to a surface of the light reflecting layer facing the light absorbing layer, or on a surface of the light absorbing layer opposite to a surface of the light absorbing layer facing the light reflecting layer.

3. The decoration member of claim 1, wherein the color expression layer further comprises a transparent substrate provided on a surface of the light reflecting layer opposite to a surface of the light reflecting layer facing the light absorbing layer, or on a surface of the light absorbing layer opposite to a surface of the light absorbing layer facing the light reflecting layer.

4. The decoration member of claim 1, wherein the light absorbing layer has a dichroism of $\Delta E^*ab>1$, wherein $\Delta E^*ab>1$ is a distance in a space of $L^*a^*b^*$ in color coordinates CIE $L^*a^*b^*$ of the color expression layer.

5. The decoration member of claim 1, wherein an upper surface of the light absorbing layer comprises a pattern having a protruding portion or a recess portion in the shape of a cone, a pattern having a protruding portion of which a highest point is formed as a line or a recess portion of which a lowest point is formed as a line, or a pattern having a protruding portion or a recess portion having a structure in which an upper surface is cut in a cone shape.

6. The decoration member of claim 5, wherein the pattern having a protruding portion or the recess portion formed in the shape of a cone has a plurality of forms of which two or less forms have an identical shape when viewed from an upper surface of the pattern while rotating the pattern 360° around an apex of the cone.

7. The decoration member of claim 5, wherein the pattern having the protruding portion of which the highest point is formed as the line or the recess portion of which the lowest point is formed as the line has a plurality of forms of a same shape when viewed from an upper surface of the pattern while rotating of the pattern 360° based on a center of gravity.

8. The decoration member of claim 1, wherein the light absorbing layer has a refractive index of 0 to 8 at 400 nm.

9. The decoration member of claim 1, wherein the light absorbing layer has an extinction coefficient of larger than 0 to 4 or less at 400 nm.

10. The decoration member of claim 1, wherein the substrate for the cosmetic container comprises a plastic molding or a glass substrate for a cosmetic container.

11. The decoration member of claim 10, wherein the plastic molding comprises one or more selected from polypropylene (PP), polystyrene (PS), polyvinyl acetate (PVAC), polyacrylate, polyethylene terephthalate (PET), polyvinyl chloride (PVC), polymethyl methacrylate (PMMA), ethylene-vinyl acetate copolymer (EVA), polycarbonate (PC), polyamide, and styrene-acrylonitrile copolymer (SAN).

* * * * *